(12) United States Patent
Lai

(10) Patent No.: US 9,122,463 B2
(45) Date of Patent: Sep. 1, 2015

(54) SERVER AND HEAT DISSIPATION SYSTEM THEREOF

(71) Applicants: Inventec (Pudong) Technology Corporation, Shanghai (CN); INVENTEC CORPORATION, Taipei (TW)

(72) Inventor: Ling-Jun Lai, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 217 days.

(21) Appl. No.: 14/044,880

(22) Filed: Oct. 3, 2013

(65) Prior Publication Data

US 2015/0043157 A1 Feb. 12, 2015

(30) Foreign Application Priority Data

Aug. 9, 2013 (CN) .......................... 2013 1 0346921

(51) Int. Cl.
*G06F 1/20* (2006.01)
*H05K 5/00* (2006.01)
*H05K 7/20* (2006.01)

(52) U.S. Cl.
CPC .............. *G06F 1/20* (2013.01); *H05K 7/20727* (2013.01)

(58) Field of Classification Search
CPC .. G06F 1/20; H05K 7/20727; H05K 7/20736; H05K 7/20145; H05K 7/20454

USPC ............... 361/679.46–679.54, 688–723; 165/80.1–80.5, 104.33, 185; 257/712–722, E23.087, E23.088; 454/184

See application file for complete search history.

(56) References Cited

U.S. PATENT DOCUMENTS

| | | | |
|---|---|---|---|
| 9,007,762 B2* | 4/2015 | Toya ....................... | 361/679.46 |
| 2004/0182540 A1* | 9/2004 | Motoyama et al. ............. | 165/46 |
| 2010/0317278 A1* | 12/2010 | Novick ......................... | 454/184 |
| 2011/0058330 A1* | 3/2011 | Abraham et al. ........ | 361/679.47 |
| 2011/0103060 A1* | 5/2011 | Wang et al. .............. | 362/249.02 |
| 2014/0098493 A1* | 4/2014 | Chen et al. .................... | 361/692 |
| 2015/0153113 A1* | 6/2015 | Glover et al. ................. | 361/692 |
| 2015/0153793 A1* | 6/2015 | Hsu .......................... | 361/679.47 |

* cited by examiner

*Primary Examiner* — Anthony Haughton
*Assistant Examiner* — Yahya Ahmad
(74) *Attorney, Agent, or Firm* — CKC & Partners Co., Ltd.

(57) ABSTRACT

A server includes a chassis, processing units and an airflow generating device. The processing units are disposed inside the chassis for heat dissipation of the processing units. Each processing unit includes a motherboard, an electric heat source, a heat dissipation fin set and a stopping air bag. The electric heat source is disposed on the motherboard, the heat dissipation fin set is attached to the electric heat source and the stopping air bag including an air inlet opening is located at space between the heat dissipation fin set and one of the processing units which is adjacent to the stopping air bag. When the airflow generating devices are operated, air is blown into the stopping air bag through the air inlet opening so that the stopping air bag is inflated to occupy the space to stop an airflow from flowing through the space.

20 Claims, 3 Drawing Sheets

SERVER AND HEAT DISSIPATION SYSTEM THEREOF

RELATED APPLICATIONS

This application claims priority to Chinese Patent Application Ser. No. 201310346921.9, filed Aug. 9, 2013, which is herein incorporated by reference.

BACKGROUND

1. Field of Invention

The present invention relates to a server and a heat dissipation system thereof and, more specifically, to a server and a heat dissipation system thereof that is capable of enhancing the efficiency of the thermal dissipation.

2. Description of Related Art

Comparing with a conventional serve, a blade server saves the utilization space so that it becomes the mainstream among various servers. Generally, the blade server has an integrated housing and its servers are centralized management, thereby significantly compacting the utilization of space in a blade server, but resulting the issue of the thermal dissipation.

Especially, owing to the rapid development of the semiconductor process, the fabrication technology of the CPU (Central Processing Unit) or other chip set is developed from micrometer scale to nanometer scale. The number of FETs (Field Effect Transistor) of a single chip may be more than a thousand million. Thus, during the operation of the chip set, a considerable quantity of heat is generated.

To solve the issue of the thermal dissipation, typically, a heat dissipation fin set is mounted on a processor. Any number of fans may be used to dissipate the heat generated by the processor. However, a blade server typically consists of several mother boards which are adjacent to each other in a parallel manner. The space between two adjacent mother boards allows air flowing within it, and thus causing air has low tendency to pass through the heat dissipation fins so that the efficiency of the heat dissipation gets worse.

SUMMARY

In one aspect of the present invention is related to a stopping air bag disposed in a server to prevent the air passing through the space between two adjacent mother boards so that the issue mentioned above is solved.

According to one embodiment of the present invention, a server includes a chassis, a plurality of processing units and an airflow generating device. The processing units are disposed inside the chassis in an array manner and each processing unit includes a motherboard, an electric heat source, a heat dissipation fin set and a stopping air bag. The electric heat source is disposed on the motherboard, the heat dissipation fin set is attached to the electric heat source and the stopping air bag including an air inlet opening is located at a space between the heat dissipation fin set and one of the processing units which is adjacent to the stopping air bag. The airflow generating device is disposed inside the chassis for heat dissipation of the processing units and when the airflow generating device is operated, air is blown into the stopping air bag through the air inlet opening so that the stopping air bag is inflated to occupy the space to stop the airflow generated by the airflow generating device from flowing through the space.

According to one embodiment of the present invention, the heat dissipation fin set includes a base and a plurality of heat dissipation fins. Each of the heat dissipation fins is erected on the base and the stopping air bag is attached on the heat dissipation fins. The gap between the adjacent heat dissipation fins is faced to the flabella the airflow generating device.

According to one embodiment of the present invention, the air inlet opening is disposed facing the airflow generating device and the stopping air bag includes an air pouch which is capable of being inflated with the air through its air inlet opening to occupy the space.

According to one embodiment of the present invention, the air inlet opening of the stopping air bag may be disposed outside the heat dissipation fin set and attached to an outer surface of an outer heat dissipation fin of the heat dissipation fin set.

According to one embodiment of the present invention, each of the processing units includes a memory. The mother board has a first surface and a second surface opposite to each other. The electric heat source and the heat dissipation fin set are disposed on the first surface, and the memory is disposed on the second surface.

According to one embodiment of the present invention, each of the processing units includes a memory. The memory is disposed on the mother board and is electrically coupled to the corresponding mother board. When the stop air bag is inflated, the topping air bag is clamped by the heat dissipation fin set and the memory of the adjacent processing unit.

According to one embodiment of the present invention, the mother board is configured with an electrical connector coupling to the memory. Each of the memory is parallel to the mother board respectively.

According to one embodiment of the present invention, the air inlet opening of the stopping air bag may be disposed along a direction on one side of the heat dissipation fin set, wherein the direction is parallel to the mother board and a blowing direction of the airflow generating device.

According to one embodiment of the present invention, the mother board further includes a gold finger interface. Each of the mother boards is parallel to each other, and the gold finger interface is inserted into a slot in the chassis respectively.

According to one embodiment of the present invention, when the airflow generating device is not operated, the stopping air bag may be attached to the respective heat dissipation fin set and is distanced from the adjacent processing unit.

According to one embodiment of the present invention, when the airflow generating device is not operated, the stopping air bag is deflated.

According to another embodiment of the present invention, a heat dissipation system is provided. The heat dissipation system includes a first processing unit, a second processing unit and an airflow generating device. The first processing unit has a stopping air bag and the second processing unit is disposed adjacent to the first processing unit. The airflow generating device is configured to face the first and the second processing unit. The stopping air bag has an air inlet opening. The stopping air bag is located at a space between the adjacent two processing units. When the airflow generating device is operated, air is blown into the stopping air bag through the air inlet opening so that the stopping air bag is inflated to occupy the space to stop an airflow generated by the airflow generating device from flowing through the space.

According to another embodiment of the present invention, each of the first and the second processing units includes a mother board, an electric heat source and a heat dissipation fin set. The electric heat source is disposed on the mother board. The heat dissipation fin set is configured to dissipate the heat from the electric heat source, and is located between the mother board and the adjacent processing units. The heat dissipation fin set is separated from the processing unit by the space. The stopping air bag is disposed on the heat dissipation fin set.

According to another embodiment of the present invention, the heat dissipation fin set includes a base and a plurality of heat dissipation fins. Each of the heat dissipation fins is erected on the base, and the stopping air bag is attached on the heat dissipation fins of the heat dissipation fin set of the first processing unit. The gap between the adjacent heat dissipation fins is faced to the airflow generating device.

According to another embodiment of the present invention, each of the first and the second processing units includes a memory. The mother board has a first surface and a second surface respectively. The electric heat source and the heat dissipation fin set are disposed on the first surface, and the memory is disposed on the second surface.

According to another embodiment of the present invention, each of the first and the second processing units includes a memory. The memory is disposed on the mother board and is electrically coupled to the corresponding mother board. When the air pouch is inflated, the air pouch is filled between the heat dissipation fin set and the memory of the adjacent second processing unit.

According to another embodiment of the present invention, the mother board is configured with an electrical connector coupling to the memory. Each of the memory is parallel to the mother board respectively.

According to another embodiment of the present invention, the air inlet opening of the stopping air bag is disposed along a direction on one side of the heat dissipation fin set. The direction is parallel to the mother board and a blowing direction of the airflow generating device.

According to another embodiment of the present invention, the mother board further includes a gold finger interface. Each of the mother boards is parallel to each other, and the gold finger interface is inserted into a slot in the chassis respectively.

According to another embodiment of the present invention, when the airflow generating device is not operated, the stopping air bag is deflated and is distanced from the adjacent second processing unit.

As described above, the present invention utilizes the stopping air bag between the adjacent processing units to occupy the space therebetween so that much more of the air may pass between the heat dissipation fins of the heat dissipation fin set and dissipate the heat of the heat dissipation fin set more efficiently but not bypass the heat dissipation fin set through the space.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
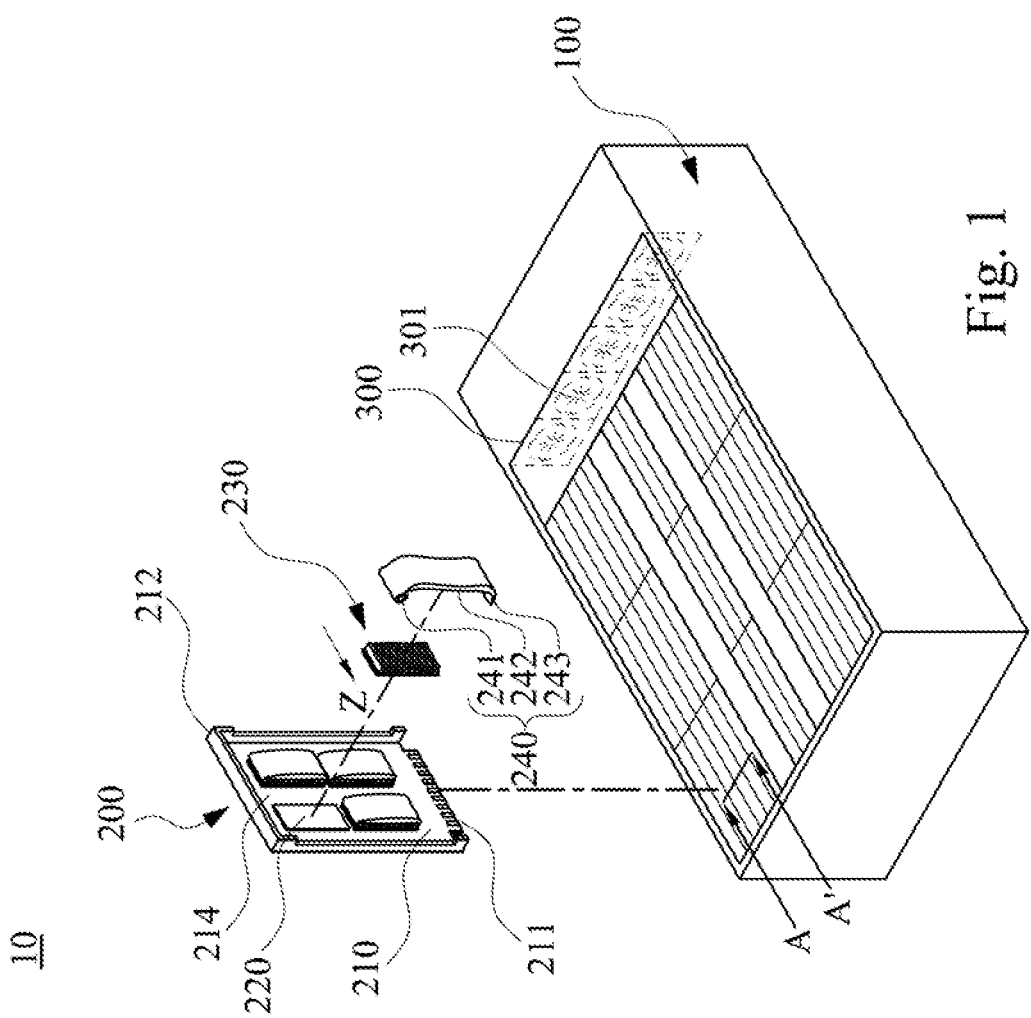
FIG. 1 is a schematic drawing of a sever according to the first embodiment of the present invention.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing of a server according to the first embodiment of the present invention. As shown in FIG. 1, a server 10 includes a chassis 100, a plurality of processing units 200 and an airflow generating device 300 for heat dissipation of the processing units 200. In the present embodiment, the processing units 200 are disposed inside the chassis 100 in an array manner. Each of the processing units 200 is inserted into a slot inside the chassis 100 and is replaceable. The airflow generating device 300 is located inside the chassis and is nearby the rear end of the chassis. The airflow generating device 300 is configured to dissipate the heat of the processing units 200 to the outside environment. For example the airflow generating device 300 is a fan or several fans.

Figure 2:
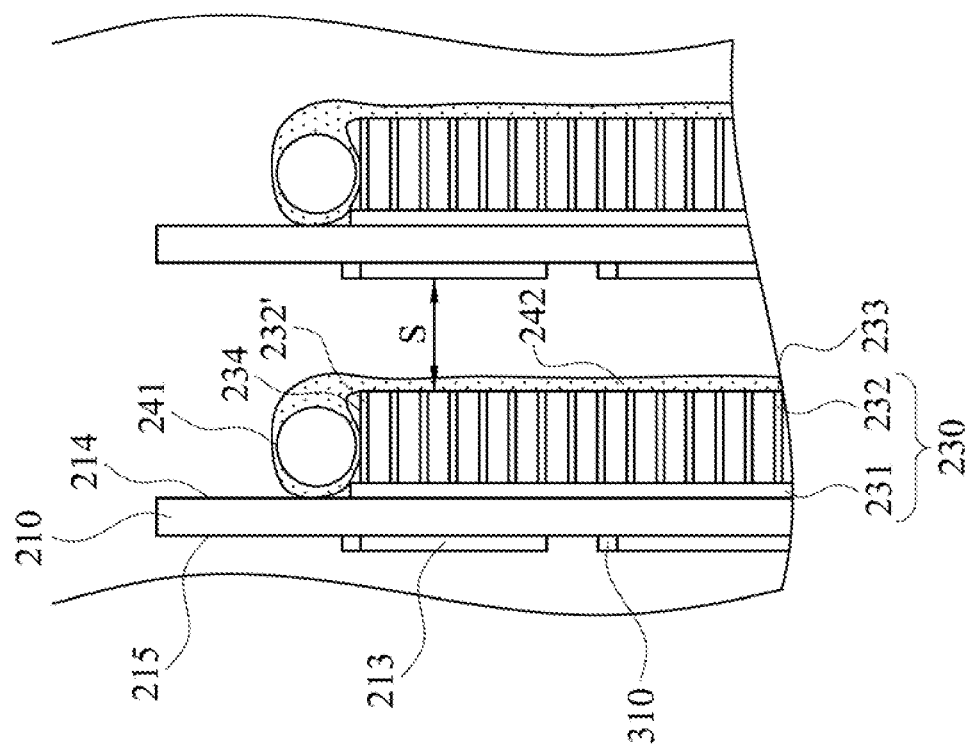
FIG. 2 is a cross-section view of a heat dissipation system along the section line A-A' of FIG. 1 according to the first embodiment of the present invention before the heat dissipation system is operated.
Figure 3:
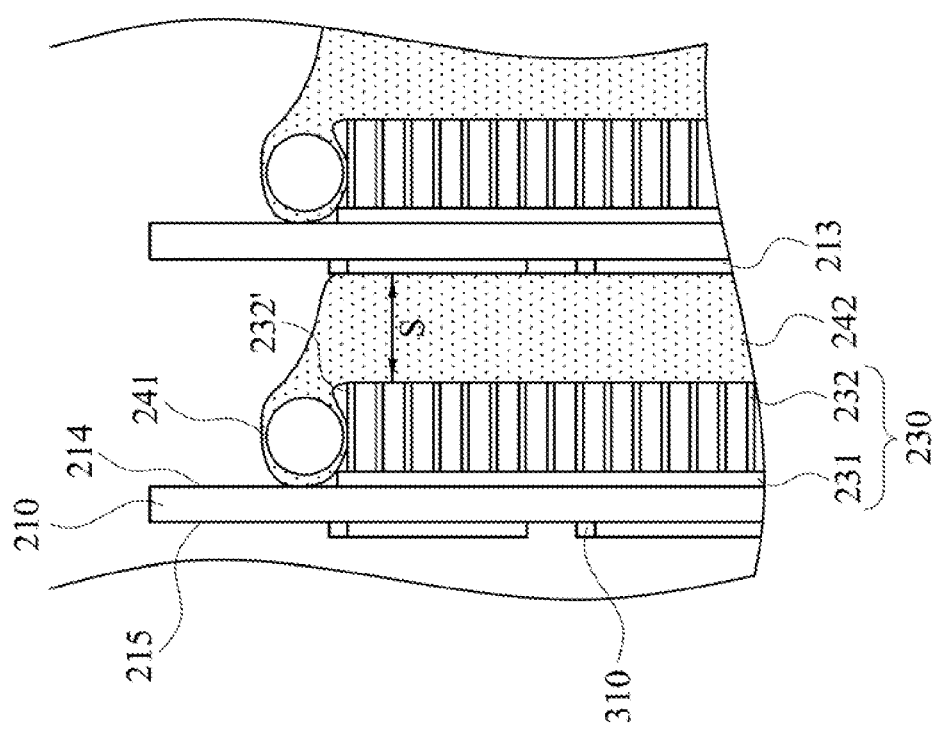
FIG. 3 is a cross-section view of a heat dissipation system along the section line A-A' of FIG. 1 according to the first embodiment of the present invention when the heat dissipation system is in an operating state.

In this embodiment, each of the processing units 200 further includes a mother board 210, an electric heat source 220, a heat dissipation fin set 230, a stopping air bag 240 and a memory 213 (shown in FIG. 2 and FIG. 3). The mother board 210 has a gold finger interface 211 which is adapted to insert into a slot inside the chassis 100 of the server 10. In this embodiment, each of the processing units 200 is held by a frame 212 and the gold finger interface 211 of the mother board 210 is exposed outside the frame 212. Accordingly, the user may insert or draw the processing units 200 into/out the chassis 100 by the frame 212. In the chassis 100, each of the mother boards is parallel to each other and is capable of inserting into the slot inside the chassis 100 and the mother boards 210 are vertically related to the inner bottom of the chassis 100.

The electric heat source 220 may generate heat, for example, a CPU (Central Processing Unit), a processor or the like device, but is not limited thereto. The mother board 200 has a first surface 214 and a second surface 215 (shown in FIG. 2 and FIG. 3) opposite to the first surface 214. The electric heat source 220 and the heat dissipation fin set 230 are disposed on the first surface 214, and the memory 213 is disposed on the second surface 215.

In other words, the memory 213 is disposed on the corresponding mother board 210, and the mother board 210 is configured with an electrical connector 310 coupling to the memory 213. As a result, the memory 213 can be disposed parallel to the corresponding mother board 210 and be electrically coupled to the mother board 210. When the stopping air bag 240 is inflated, which is clamped by the heat dissipation fin set 230 and the memory 213 of the adjacent processing unit 200. It should be noted that, the memory 213 is electrically coupled to the mother board 210 by inserting into the electrical connector 310 so that there is a minute gap between the memory 213 and the mother board 210, even not shown in the Figures.

The electric heat source 220 is disposed on the mother board 210, and the heat dissipation fin set 230 is attached to the electric heat source 220. Therefore, the heat generated by the electric heat source 220 can be dissipated to the outer environment through the thermal conduction effect of the heat dissipation fin set 230 and the thermal convection effect from the airflow generating device 300's operation.

It should be noted that during the airflow generating device 300 is operated, the heat dissipation efficiency of the heat dissipation system for the serve 10 according to this embodiment may be improved by inflating the stopping air bag 240. The details are described below by referring to FIG. 1, FIG. 2 and FIG. 3. FIG. 2 is a cross-section view of a heat dissipation system along the section line A-A' of FIG. 1 according to the first embodiment of the present invention before the heat dissipation system is operated. FIG. 3 is a cross-section view of a heat dissipation system along the section line A-A' of FIG. 1 according to one embodiment of the present invention wherein the heat dissipation system is in an operating state. As shown in the Figures, the heat dissipation system of the server 10 includes the airflow generating device 300 and the stopping air bag 240. The stopping air bag 240 has a air inlet opening 241. The stopping air bag 240 is located in the space S between the heat dissipation fin set 230 and the adjacent processing unit 200. When the airflow generating device 300 of the heat dissipation system of the server 10 is not operated, the stopping air bag 240 is not inflated so that the stopping air bag is deflated and in a limp manner, as shown in FIG. 2. In the meantime, the stopping air bag 240 is attached on the corresponding heat dissipation fin set 230 and separated from the adjacent processing unit 200. Therefore, the stopping air bag 240 will not affect the inserting/drawing actions of the processing unit 200 and those adjacent processing unit 200. When the airflow generating device 300 of the heat dissipation system of the server 10 is operated, the stopping air bag may be inflated, as shown in FIG. 3.

The air inlet opening 241 of the stopping air bag 240 is adapted to allow the air pass through so that the stopping air bag 240 is inflated and to occupy the space S. That is, when the airflow generating device 300 is actuated, the air in the chassis 100 is blown into the stopping air bag 240 through the air inlet opening 241 so that the stopping air bag 240 is inflated and to occupy the space S. Therefore, in this embodiment, the air in the server 10 will not flow above the top of the heat dissipation fin set 230, that is, the airflow generated by the airflow generating device is stopped to flow in the space S by the inflating stopping air bag between the heat dissipation fin set 230 and the adjacent processing unit 200, and it makes much more air of the airflow pass through the heat dissipation fin set 230 to take the heat generated by the electric heat source 220 away. The bigger size the air inlet opening 241 has, the more easily the airflow generating device 300 inflates the stopping air bag 240. However, the size of the air inlet opening is restricted by the inner space of the server 10.

Accordingly, the inflated stopping air bag 240 occupies the space S so that much more air will flows through from the heat dissipation fin set and the air convection effect in the heat dissipation fin set is improved. Thus, the heat of the heat dissipation fin assembly is dissipated more rapidly.

In more detail, the heat dissipation fin set 230 may further include a base 231 and a plurality of heat dissipation fins 232. Each of the heat dissipation fins 232 is disposed vertically on the base 231 in an array manner, and the stopping air bag 240 is attached on the heat dissipation fins 232 of the heat dissipation fin set 230. In this embodiment, the tail end 233 of each of the heat dissipation fins 232 may face the space S, but is not limited thereto. In other embodiments of present invention, the tail end 233 of the heat dissipation fins 232 may be bent so that the tail end 233 of the heat dissipation fins 232 faces each other.

The flabellum 301 of the airflow generating device 300 faces the space between the adjacent heat dissipation fins. When the airflow generating device 300 is operated, the stopping air bag 240 stops the air in the space S from flowing so that the air convection effect in the space between the heat dissipation fins 232 of the heat dissipation fin set 230 is improved. Accordingly, the heat of the electric heat source 220 is dissipated.

The stopping air bag 240 may further include an air pouch 242. In this embodiment, the air pouch 242 is disposed on the tail end 233 of the heat dissipation fin. The air inlet opening 241 is disposed outside the heat dissipation surface 234 of the outer heat dissipation fin 232 of the heat dissipation fin set 230. When the air pouch 242 is inflated, the air pouch 242 is held between the heat dissipation fin set 230 and the memory 213 of the adjacent processing unit 200 so that the air is stopped from flowing in the space S and the air convection effect in the gap between the heat dissipation fins 232 is enhanced.

It should be emphasized that according to this embodiment, the stopping air bag 240 is disposed on the outer heat dissipation fin 232 of the heat dissipation fin set 230 in an engagement manner. In more detail, the stopping air bag 240 may further include an engaging portion 243. The engaging portion 243 and the air inlet opening 241 are located on the opposite ends of the air pouch 242 respectively. As shown in FIG. 1, the engaging portion 243 is held between the adjacent two heat dissipation fin sets 230 The air inlet opening 241 is disposed outside the heat dissipation surface 234 of the outer heat dissipation fin 232 in adhesion or melting manner. That is, the air inlet opening 241 of the stopping air bag 240 is disposed on one side of the heat dissipation fin set 230 along the direction Z. The direction Z is parallel to the mother board 210 and the blowing direction of the airflow generating device 300.

However, this disclosure is not limited to the structure described above. In other embodiments, the engaging portion 243 may be in the form of a second air inlet opening (similar to the design of the air inlet opening 241). Accordingly, the inflating effect of the stopping air bag 240 is improved. The engaging portion 243 is disposed outside the heat dissipation surface 234 of the outer heat dissipation fin 232 of the heat dissipation fin set 230 or is held between the adjacent two heat dissipation fins assemblies 230 in an engagement manner.

To sum up, the server in some embodiment utilizes the stopping air bag stopping the air flowing between the heat dissipation fin set and the adjacent processing unit so that the heat dissipation system of the server according to some embodiment dissipate the heat from the heat dissipation surface of the heat dissipation fins more efficiently.

While preferred embodiments of the present disclosure have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:
1. A server comprising:
a chassis;
a plurality of processing units disposed inside the chassis in an array manner, each of the processing units comprising:
a mother board;
an electric heat source disposed on the mother board;
a heat dissipation fin set attached to the electric heat source; and
a stopping air bag having an air inlet opening and being located at a space between the heat dissipation fin set and one of the processing units which is adjacent to the stopping air bag; and an airflow generating device disposed inside the chassis for heat dissipation of the processing units, and when the airflow generating device is operated, air is blown into the stopping air bag through the air inlet opening so that the stopping air bag is inflated to occupy the space to stop an airflow generated by the airflow generating device from flowing through the space.

2. The server of claim 1, wherein the heat dissipation fin set comprises a base and a plurality of heat dissipation fins, the plurality of heat dissipation fins being erected on the base, the stopping air bag being attached on the heat dissipation fins, and the gap between the adjacent heat dissipation fins being faced to the airflow generating device.

3. The server of claim 2, wherein the air inlet opening is disposed facing the airflow generating device and the stopping air bag further comprises an air pouch capable of being inflated with the air through the air inlet opening to occupy the space.

4. The server of claim 2, wherein the air inlet opening of the stopping air bag is disposed outside the heat dissipation fin set and attached to an outer surface of an outer heat dissipation fin of the heat dissipation fin set.

5. The server of claim 1, wherein the mother board has a first surface and a second surface opposite to each other and each of the processing units further comprises a memory, the electric heat source and the heat dissipation fin set being disposed on the first surface, and the memory being disposed on the second surface.

6. The server of claim 1, wherein each of the processing units further comprises a memory disposed on the mother board and electrically coupled to the mother board, and when the stopping air bag is inflated, the stopping air bag is clamped by the heat dissipation fin set and the memory of the adjacent processing unit.

7. The server of claim 6, wherein the mother board is configured with an electrical connector coupling to the memory, each of the memory being parallel to the mother board respectively.

8. The server of claim 1, wherein the air inlet opening of the stopping air bag is disposed along a direction on one side of the heat dissipation fin set, the direction being parallel to the mother board and a blowing direction of the airflow generating device.

9. The server of claim 1, wherein the mother board further comprises a gold finger interface, each of the mother boards is parallel to each other and the gold finger interface is inserted into a slot in the chassis respectively.

10. The server of claim 1, wherein when the airflow generating device is not operated, the stopping air bag is attached to the respective heat dissipation fin set and is distanced from the adjacent processing unit.

11. The server of claim 10, wherein when the airflow generating device is not operated, the stopping air bag is deflated.

12. A heat dissipation system comprising:
a first processing unit having a stopping air bag;
a second processing unit adjacent to the first processing unit; and
an airflow generating device configured to face the first and the second processing unit;
wherein the stopping air bag has an air inlet opening and the stopping air bag is located at a space between the adjacent two processing units, and when the airflow generating device is operated, air is blown into the stopping air bag through the air inlet opening so that the stopping air bag is inflated to occupy the space to stop an airflow generated by the airflow generating device from flowing through the space.

13. The heat dissipation system of claim 12, wherein each of the first and the second processing units comprises a mother board, an electric heat source and a heat dissipation fin set, the electric heat source being disposed on the mother board, the heat dissipation fin set being configured to dissipate the heat from the electric heat source and being located between the mother board and the adjacent processing unit, the heat dissipation fin set being separated from the processing unit by the space and the stopping air bag being disposed on the heat dissipation fin set.

14. The heat dissipation system of claim 13, wherein the heat dissipation fin set comprises a base and a plurality of heat dissipation fins, the plurality of heat dissipation fins being erected on the base, and the stopping air bag being attached on the heat dissipation fins of the heat dissipation fin set of the first processing unit, and the gap between the adjacent heat dissipation fins being faced to the airflow generating device.

15. The heat dissipation system of claim 13, wherein each of the first and the second processing units further comprises a memory, the mother board having a first surface and a second surface opposite to each other, the electric heat source and the heat dissipation fin set being disposed on the first surface, the memory being disposed on the second surface.

16. The heat dissipation system of claim 13, wherein each of the first and the second processing units comprises a memory disposed on the mother board and electrically coupled to the mother board, when the stopping air bag is inflated, the stopping air bag is held between the heat dissipation fin set of the first processing unit and the memory of the adjacent second processing unit.

17. The heat dissipation system of claim 16, wherein the mother board is configured with an electrical connector coupling to the memory, each of the memory being parallel to the mother board respectively.

18. The heat dissipation system of claim 13, wherein the air inlet opening of the stopping air bag is disposed along a direction on one side of the heat dissipation fin set, the direction being parallel to the mother board and a blowing direction of the airflow generating device.

19. The heat dissipation system of claim 13, wherein the mother board further comprises a gold finger interface, and each of the mother boards is parallel to each other, and the gold finger interface is inserted into a slot in the chassis respectively.

20. The heat dissipation system of claim 12, wherein when the airflow generating device is not operated, the stopping air bag is deflated and is distanced from the adjacent second processing unit.

* * * * *